United States Patent [19]

Phan et al.

[11] Patent Number: 5,202,645
[45] Date of Patent: Apr. 13, 1993

[54] STABILIZED TRANSIENT RESPONSE OF A CASCODE CMOS AMPLIFIER

[75] Inventors: Christina P. Q. Phan, Milpitas; James B. Wieser, Pleasanton, both of Calif.

[73] Assignee: National Semiconductor Corporation, Santa Clara, Calif.

[21] Appl. No.: 805,758

[22] Filed: Dec. 12, 1991

[51] Int. Cl.[5] .............................................. H03F 3/45
[52] U.S. Cl. .................................... 330/253; 330/257; 330/311; 330/260
[58] Field of Search ................. 330/253, 257, 311, 260

[56] References Cited

U.S. PATENT DOCUMENTS 4,405,900  9/1983  Van De Plassche ........... 330/253 X
4,829,266  5/1989  Pernici et al. .................... 330/311 X Primary Examiner—James B. Mullins
Attorney, Agent, or Firm—Gail W. Woodward; Irving S. Rappaport; James W. Rose

[57] ABSTRACT

Operational amplifiers are often used in unity gain configurations where the output is fed back to the input. In the noninverting buffer configuration the output is directly connected to the inverting input and the circuit becomes a voltage follower. In many cases, the input stage includes cascode coupled transistors which isolate the current mirror load from the differentially operated input transistors. Such cascode transistors act to increase gain to reduce noise and to increase the power supply rejection ratio. When cascode coupled transistors are employed the frequency compensation capacitor can be isolated from loading effects on the input stage, thus, further enhancing the value of a cascoded input stage. However, when such an operational amplifier is operated as a unity gain device its transient response can suffer. Negative output transitions can result in circuit ringing following the negative output transient steps. The invention consists of adding constant current transistors in parallel with the first stage current mirror load elements. It has been shown that such constant current transistors remove the ringing problem without degrading any of the desired circuit parameters.

8 Claims, 3 Drawing Sheets

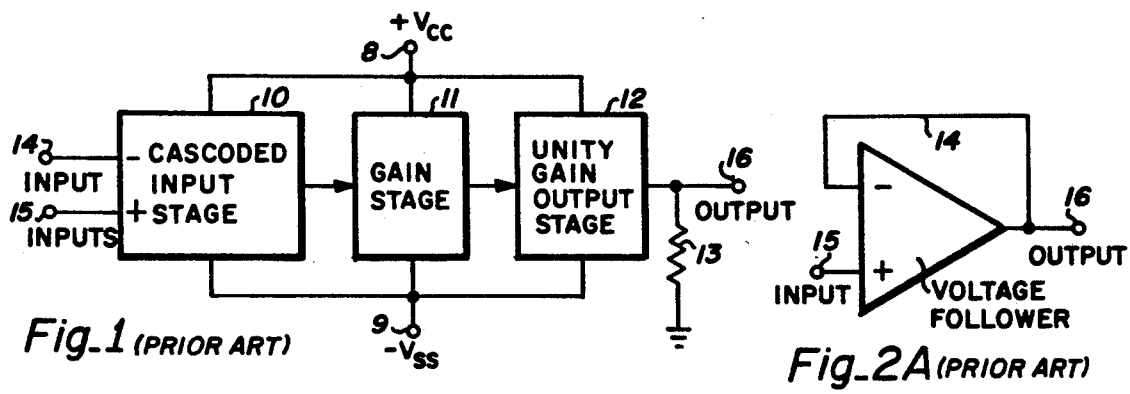
Fig_1 (PRIOR ART)
Fig_2A (PRIOR ART)
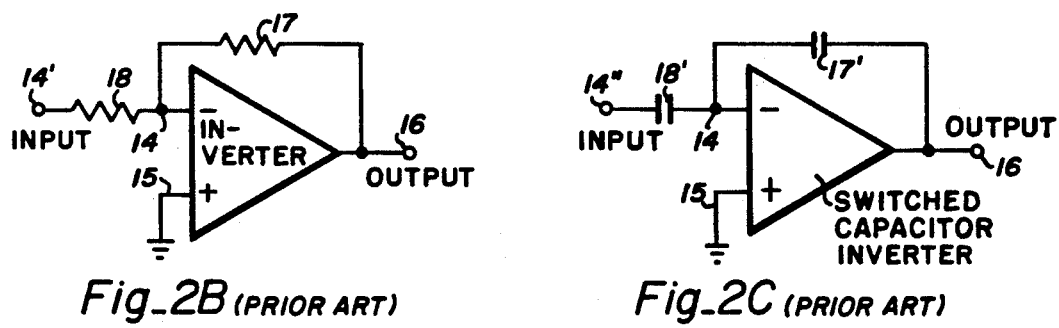
Fig_2B (PRIOR ART)
Fig_2C (PRIOR ART)
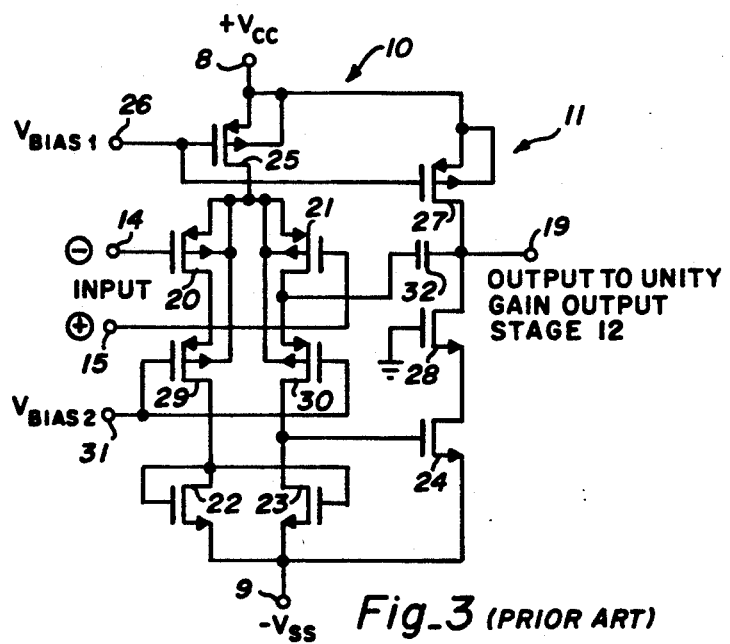
Fig_3 (PRIOR ART)

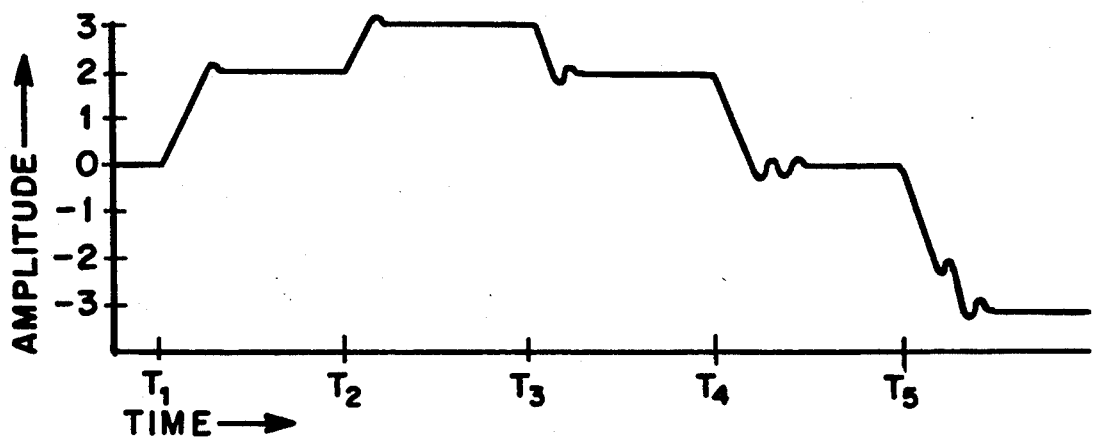
Fig_6
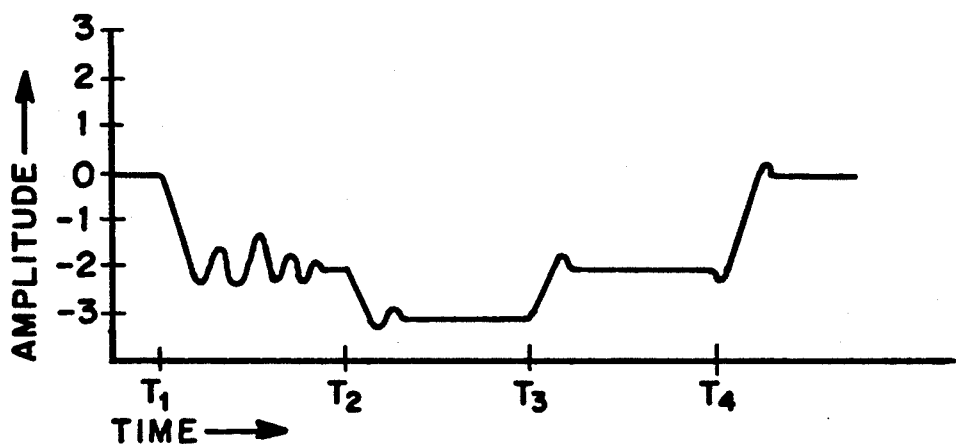
Fig_7
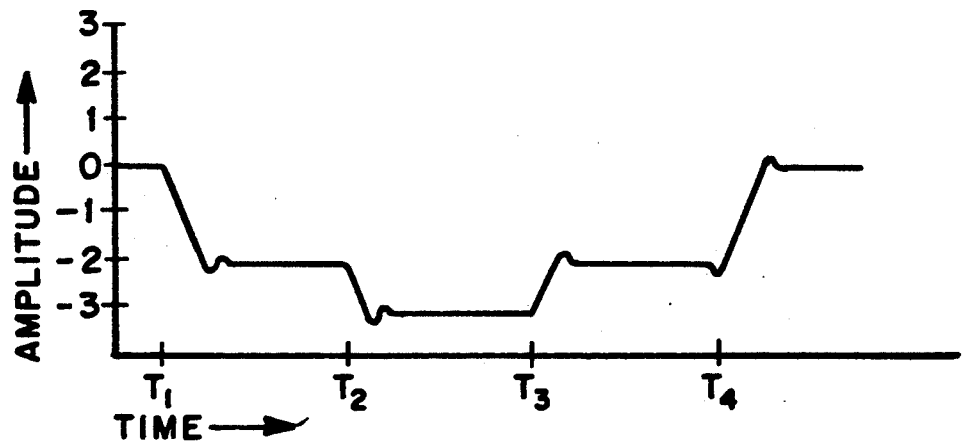
Fig_8

STABILIZED TRANSIENT RESPONSE OF A CASCODE CMOS AMPLIFIER

BACKGROUND OF THE INVENTION

The invention mainly relates to complementary metal oxide semiconductor (CMOS) amplifiers and, in particular, is useful in bipolar CMOS (BiCMOS) forms of integrated circuit (IC) construction. In this latter circuit form a CMOS wafer is designed to include bipolar transistors along with insulated gate monopolar transistors so that the integrated circuits can have the advantages of both of the basic configurations.

Typically, operational amplifiers (op-amps) have taken the form shown in FIG. 1. A differential input stage 10 is followed by a gain stage 11 which drives a unity-gain output stage 12 that is capable of supplying a suitable power output at terminal 16 to load 13. Terminals 14 and 15 respectively comprise the inverting − and noninverting + differential inputs. The op-amp is operated from a power supply connected via supply lines 8 for $+V_{CC}$ and 9 for $-V_{SS}$. FIG. 2A is a block diagram wherein the op-amp is connected as a unity gain inverter which functions as a voltage follower. For the connections shown, where the output 16 is connected directly to the inverting input, the output voltage at terminal 16 will closely follow the voltage at terminal 15. By way of example, using a 13.5 k ohm resistor as load element 13, the op-amp will supply a +3.1 volt output capability when using +5 volt supplies. A ground reference exists midway between $+V_{CC}$ and $-V_{SS}$.

FIG. 2B shows the op-amp connected as an inverting amplifier. Here a pair of resistors, 17 and 18, couple output terminal 16 to input terminal 14'. The resistor juncture is connected to the inverting input 14 of the op-amp and the non-inverting input 15 is grounded. The gain of the inverter is determined by the relative values of resistors 17 and 18. When they are equal the gain is unity.

FIG. 2c shows a charge inverter version of an op-amp. Capacitors 17' and 18' couple output terminal 16" to input terminal 14". The capacitor juncture is connected to the inverting input of the op-amp and the noninverting input is grounded. The gain of the inverter is determined by the relative values of capacitors 17' and 18'. When they are equal the gain is unity.

It is common practice to employ cascoded input and gain stages in the op-amp to provide good power supply rejection ratios along with high signal gain and low noise performance. As is typical in op-amp design, capacitive feedback is employed for frequency compensation. U.S. Pat. No. 4,484,148, which is assigned to the assignee of the present invention, shows such compensation. The teaching in this patent is incorporated herein by reference.

FIG. 3 is a schematic diagram showing a typical CMOS version of stages 10 and 11 of FIG. 1A. Unity gain output stage 12 is conventional and will not be further described herein. The input stage 10 includes P channel transistors 20 and 21, the gates of which are driven from the inverting and noninverting inputs 14 and 15 respectively. N channel transistors 22 and 23 form a conventional current mirror load which provides the differential to single ended output conversion and acts to drive the gate of N channel gain transistor 24.

P channel transistor 25, which is biased into conduction by the potential at terminal 26, is connected to the common sources of transistors 20 and 21 thereby to operate them differentially. Thus, transistor 25 is the tail current source for the differential input stage 10.

P channel transistor 27 has its gate biased in parallel with that of transistor 25 so that it too acts as a current source for gain stage 11. Thus, transistor 27 is the load element for transistor 24 and the stage output 19 is taken from the drain of transistor 27. Transistor 28 is cascode connected to transistor 24 and its gate is referenced at ground. Thus, gain stage 11 is cascoded thereby deriving the benefits of cascode operation.

P channel transistors 29 and 30 are respectively cascode connected between the drains of transistors 20 and 21 and load transistors 22 and 23 to provide a cascode connected input stage 10. The gates of transistors 29 and 30 are biased by the potential at terminal 31 to ensure that they remain saturated throughout the normal operating range of the input stage.

Capacitor 32 is the op-amp frequency compensation element. It will be noted that transistor 30 acts as a common gate amplifier to couple the left hand terminal of capacitor 32 to the gate of transistor 24. Thus, the cascode transistor 30 serves the dual function which additionally isolates the compensation capacitor from the output of input stage 10 and cascode couples transistor 21 to load transistor 23. Thus, capacitor 32 does not present significant capacitive loading to input stage 10. This action is detailed in above-mentioned U.S. Pat. No. 4,484,148.

The circuit of FIG. 3 functions well as an op-amp and has proven useful as a circuit in its own right. However, when connected as shown in FIG. 2A, as a unity-gain amplifier device, it suffers from some drawbacks in terms of transient response performance. For large transients the circuit of FIG. 2B suffers similar drawbacks, but to a lesser degree.

FIG. 4 is a graph showing the output of the FIG. 1 circuit when subjected to relatively large input steps. The steps start at zero and include a +2-volt step at T1, a 1.1-volt step at T2, a −0.9-volt step at T3, a −2-volt step at T4 and, finally, a −2-volt step at T5. Thus, the range of 0 to 3.1 volts to −3.1 volts is covered. The time intervals shown involve 4 $\mu$s increments. The circuit slew rate is typically about 3 volts per microsecond. As shown in FIG. 4, the positive steps are followed fairly well with only small transient overshoots appearing at the output. However, the negative steps show a different matter. The −0.9-volt step at T3 shows ringing following the transient. The negative 2-volt step at T4 is followed by substantial ringing and the subsequent negative three volt step at T5 is followed by transient ringing. It was concluded that when a positive step is applied to the gate of transistor 21, the tail current from transistor 25 will flow into load transistor 22. This current is mirrored by transisistor 23 which will pull the gate of transistor 24 low towards cutoff. This allows transistor 27 to pull the right hand end of capacitor 32 high. Capacitor 32 will couple this rise to the source of transistor 30 thereby turning it on and it will pass a current which will charge the capacitor. Since capacitor 32 is fully operative in this set of conditions the frequency compensation will function and the circuit will be stabilized.

However, for a negative input transition to the gate of transistor 21, the tail current from transistor 25 will be diverted away from transistor 20 and, therefore, the current in transistor 22 will cease. So, too, will the current in transistor 23. As a result, transistor 30 will be cut off and the negative feedback loop around the drain to gate circuit of transistor 24 will be opened and transistor 24 will tend to oscillate. This shows up as ringing that follows the negative transient input.

SUMMARY OF THE INVENTION

It is an object of the invention to provide a modification of a cascoded differential op-amp input stage whereby the diff-amp will not ring following negative input transients.

It is a further object of the invention to employ current shunts in parallel with the current mirror load transistors in a cascoded op-amp differential input stage.

These and other objects are achieved in the following manner. A cascoded differential input stage is coupled to drive a cascoded gain stage in an op-amp circuit. The frequency compensation capacitor is connected between the gain stage output and the input stage cascode transistor so that the cascode connected transistor isolates the capacitor from the input stage output. This circuit configuration tends to ring when the noninverting op-amp is subjected to relatively large negative input transients. To overcome the ringing, the input stage current mirror load transistors are shunted with constant current elements that ensures that a current mirror load is always present to drive the gain stage transistor and is never turned off completely as a result of an input transient.

BRIEF DESCRIPTION OF THE DRAWING

FIG. 1 is a block diagram of a prior art operational amplifier connected as a unity gain buffer or voltage follower.

FIG. 2A is a block diagram showing the circuit of FIG. 1 connected as a noninverting voltage follower.

FIG. 2B is a block diagram showing the circuit of FIG. 1 connected as an inverter.

FIG. 2C is a block diagram showing a version of FIG. 1 connected as a charge inverter which might be used in a capacitor circuit application.

FIG. 3 is a schematic diagram of a prior art CMOS version of the first two blocks or stages of the operational amplifier of FIG. 1.

FIG. 6 is a graph showing the response of the FIG. 5 circuit when connected as a unity gain noninverting FIG. 7 is a graph showing the response of the circuit of FIG. 2B to a series of transient steps.

FIG. 8 is a graph showing the response of the circuit of the invention when connected as a unity gain inverting buffer.

DESCRIPTION OF THE INVENTION

Figure 5:
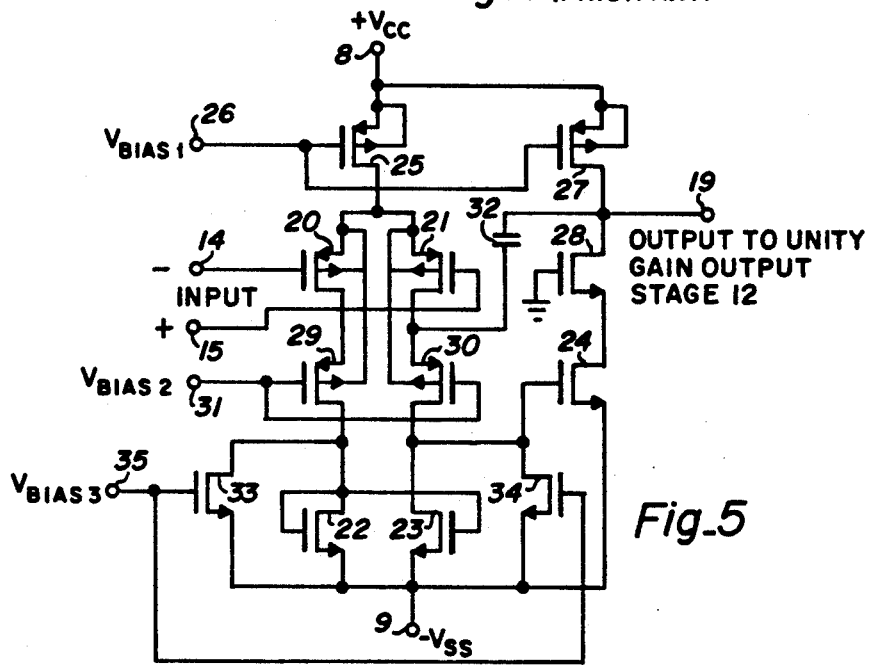
FIG. 5 is a schematic diagram of the CMOS version of the circuit of the invention.

FIG. 5 is a schematic diagram of the circuit of the invention. Where the parts are the same as those of FIG. 3 the same numerals are employed. The main difference is the addition of two N channel transistors 33 and 34. These two devices shunt load transistors 22 and 33 respectively and their gates are biased by the potential $V_{BIAS3}$ which is applied to terminal 35. Transistors 33 and 34 each act to conduct a current that is passed through the related cascode transistors and the differentially operated input transistors.

With regard to transistor 23, transistor 34 conducts a parallel current that flows in transistors 21 and 30. Thus, even if transistor 23 is cut off, as a result of a negative step applied to transistor 21, the current flowing in transistor 34 will keep transistor 30 active thereby maintaining the frequency compensation loop active and functional. This action eliminates the ringing that was described above for FIG. 3. Transistor 33 shunts load transistor 22 thereby maintaining the differential circuit balance. The value of $V_{BIAS3}$ is selected so that the transient ringing is eliminated, but the conduction of transistors 33 and 34 is not so great as to overpower the operation of transistors 22 and 23.

Figure 4:
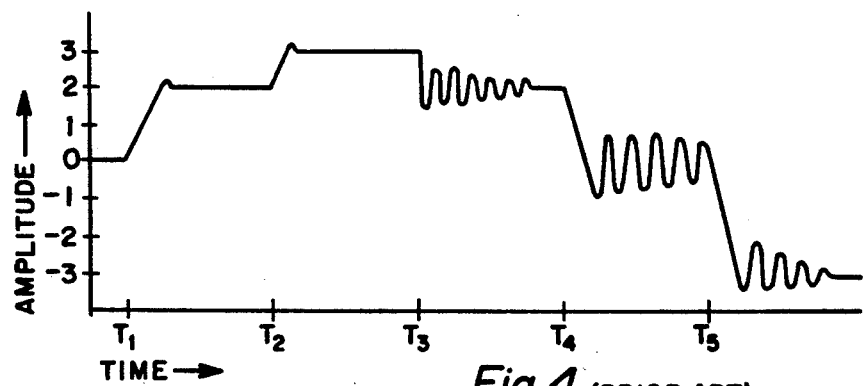
FIG. 4 is a graph showing the response of the prior art circuit of FIG. 2 to a series of transient steps.

FIG. 6 shows the resultant transient step output similar to the showing in FIG. 4. The absence of ringing after the negative going steps speaks for itself.

FIG. 7 shows the transient response of the circuit of FIG. 2 when using the FIG. 3 configuration. Note the ringing associated with the first two-volt negative swing. FIG. 8 shows the same input steps as applied to the FIG. 2 circuit when the circuit of FIG. 5 is employed in input stage 10 and gain stage 11.

Figures 9, 10:
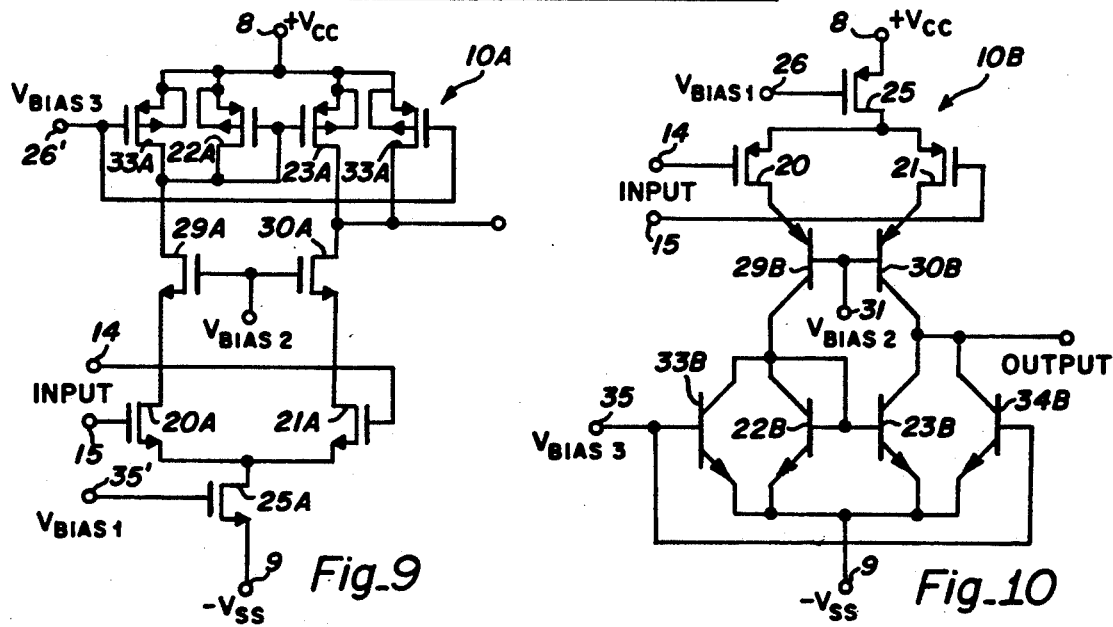
FIG. 9 is a schematic diagram of the first stage of the circuit of the invention when constructed as the complement to that of FIG. 5.
FIG. 10 is an alternative circuit of the invention showing the use of bipolar transistors along with MOS transistors.

It is to be understood that the circuit shown in FIG. 5 can take several alternative forms. For example, FIG. 9 shows an input stage 10A which employs complementary devices in place of the circuit in FIG. 5. Also, bipolar transistors can be employed in the circuit. P channel transistors can be replaced with PNP transistors and N channel transistors can be replaced with NPN transistors.

In FIG. 10, PNP transistors 29B and 30B have replaced P channel transistors 29 and 30. N channel transistors 22, 23, 33 and 34 have been replaced with NPN transistors 22B, 23B, 33B and 34B. The circuits of 9 and 10, or other combinations of MOS and bipolar transistors, can operate and benefit by the invention in terms of improved transient step performance.

The invention has been described and a preferred embodiment detailed. Alternatives have also been described. When a person skilled in the art reads the foregoing description, other alternatives and equivalents, within the spirit and intent of the invention, will be apparent. Accordingly, it is intended that the scope of the invention be limited only by the claims that follow.

We claim:

1. In an operational amplifier employing a differential input stage followed by a gain stage with the input stage employing a current mirror load and cascode connected transistors isolating said current mirror load, said operational amplifier further employing a stabilizing frequency compensation capacitor coupled between said gain stage output and said cascode transistor in said input stage, the improvement comprising:

means for coupling the output of said operational amplifier to its inverting input so that the operational amplifier functions as a voltage follower; and first and second constant current transistors coupled across the elements of said current mirror load whereby said operational amplifier is immune from ringing following the application of a step transient to said input stage.

2. The operational amplifier of claim 1 wherein said input stage employs differentially operated metal oxide semiconductor transistors.

3. The operational amplifier of claim 2 wherein said input and gain stages are composed of complementary metal oxide semiconductor transistors.

4. The operational amplifier of claim 1 wherein said gain stage is also cascode-connected.

5. The operational amplifier of claim 1 wherein said gain stage is buffered by an output stage that provides the drive required by a load element.

6. The operational amplifier of claim 1 wherein said circuit employs bipolar transistors.

7. In an operational amplifier having an input terminal and employing a differential input stage followed by a gain stage with the input stage employing a current mirror load and cascode connected transistors isolating said current mirror load, said operational amplifier further employing a stabilizing frequency compensation capacitor coupled between said gain stage output and said cascode transistor in said input stage, the improvement comprising:

two impedances coupled in series between the output of said operational amplifier and the circuit input terminal, the impedances juncture being connected to the operational amplifier inverting input whereby said circuit operates as an inverting buffer having a gain determined by the values of said two impedances; and first and second constant current transistors coupled across the elements of said current mirror load whereby said operational amplifier is immune from ringing following the application of a step transient to said input stage.

8. The operational amplifier of claim 7 wherein said impedances are two resistors matched to produce unity gain.

* * * * *